(12) United States Patent
Lu et al.

(10) Patent No.: US 11,821,081 B2
(45) Date of Patent: Nov. 21, 2023

(54) THIN FREE-STANDING OXIDE MEMBRANES

(71) Applicant: The Regents of the University of California, Oakland, CA (US)

(72) Inventors: Yi-Hsien Lu, El Cerrito, CA (US); Xiao Zhao, El Cerrito, CA (US); Matthijs van Spronsen, Berkeley, CA (US); Adam Schwartzberg, Richmond, CA (US); Miquel Salmeron, Kensington, CA (US); Carlos Morales Sanchez, Cottbus (DE)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 17/449,900

(22) Filed: Oct. 4, 2021

(65) Prior Publication Data

US 2022/0112596 A1    Apr. 14, 2022

Related U.S. Application Data

(60) Provisional application No. 63/089,885, filed on Oct. 9, 2020.

(51) Int. Cl.
| | | |
|---|---|---|
| C23C 16/40 | (2006.01) | |
| C23C 16/02 | (2006.01) | |
| C23C 16/04 | (2006.01) | |
| C23C 16/455 | (2006.01) | |
| C23C 16/01 | (2006.01) | |
| G01N 21/3577 | (2014.01) | |
| G01N 21/35 | (2014.01) | |
| G01Q 60/24 | (2010.01) | |
| G01Q 60/36 | (2010.01) | |

(52) U.S. Cl.
CPC .............. *C23C 16/40* (2013.01); *C23C 16/01* (2013.01); *C23C 16/0281* (2013.01); *C23C 16/045* (2013.01); *C23C 16/45536* (2013.01); *G01N 21/3577* (2013.01); *G01N 2021/3595* (2013.01); *G01Q 60/24* (2013.01); *G01Q 60/366* (2013.01)

(58) Field of Classification Search
None
See application file for complete search history.

(56) References Cited

U.S. PATENT DOCUMENTS

2015/0118111 A1*  4/2015  Samarao ............. G01N 27/125
                                                          438/49
2016/0329187 A1* 11/2016  Kidwell ................. C23C 16/01

OTHER PUBLICATIONS

Wang et al. "Ultrathin Oxide Films by Atomic Layer Deposition on Graphene" with Supporting Information (2012) Nano Lett., vol. 12, pp3706-3710. dx.doi.org/10.1021/nl3014956 (Year: 2012).*

(Continued)

*Primary Examiner* — Jose I Hernandez-Kenney

(57) ABSTRACT

This disclosure provides systems, methods, and apparatus related to thin free-standing oxide membranes. In one aspect, a method includes providing a substrate. The substrate defines a hole having a diameter of about 500 nanometers to 5000 nanometers. A layer of metal is deposited on the substrate. A supporting layer is deposited on the layer of metal. A first side of the supporting layer is the side that is disposed on the layer of metal. A metal oxide layer is deposited on the first side of the supporting layer and on the substrate. In some implementations, the method further includes removing the supporting layer.

17 Claims, 9 Drawing Sheets

(56) References Cited

OTHER PUBLICATIONS

Jung et al. "Phase-controlled growth of cobalt oxide thin films by atomic layer deposition" (2018). Surface & Coatings Technology 337, pp. 404-410 (Year: 2018).*

Lu et al. "Infrared Nanospectroscopy at the Graphene-Electrolyte Interface" with Supporting Information (Jul. 15, 2019). Nano Lett. vol. 19, pp. 5388-5393. dx.doi.org/10.1021/acs.nanolett.9b01897 (Year: 2019).*

Lu et al. "Ultrathin Free-Standing Oxide Membranes for Electron and Photon Spectroscopy Studies of Solid-Gas and Solid-Liquid Interfaces" (Aug. 5, 2020). Nano Lett. 2020, 20, 6364-6371. https://dx.doi.org/10.1021/acs.nanolett.0c01801 (Year: 2020).*

Merriam-Webster. (n.d.). Define. In Merriam-Webster.com dictionary. Retrieved Nov. 14, 2022, from https://www.merriam-webster.com/dictionary/define (Year: 2022).*

Lu et al., "Ultrathin Free-Standing Oxide Membranes for Electron and Photon Spectroscopy Studies of Solid-Gas and Solid-Liquid Interfaces," Nano Letter, vol. 20, No. 9, pp. 6364-6371, (Aug. 5, 2020).

Hatty et al., "Fracture Toughness, Fracture Strength, and Stress Corrosion Cracking of Silicon Dioxide Thin Films," Journal of Microelectromechanical Systems, vol. 17, No. 4, pp. 943-947, (Aug. 2008).

Striemer et al., "Charge- and size-based separation of macromolecules using ultrathin silicon membranes," Nature, vol. 445, pp. 749-753, (Feb. 15, 2007).

Daulton et al., "In Situ Environmental Cell-Transmission Electron Microscopy Study of Microbial Reduction of Chromium(VI) Using Electron Energy Loss Spectroscopy," Microscopy and Microanalysis, vol. 7, No. 6, pp. 470-485, (Jun. 13, 2001).

Yuk et al., "High-Resolution EM of Colloidal Nanocrystal Growth Using Graphene Liquid Cells," Science, vol. 336, No. 6077, pp. 61-64, (Apr. 6, 2012).

Cao et al., "Role of graphene in enhancing the mechanical properties of TiO2/graphene heterostructurest," The Royal Society of Chemistry, Nanoscale, vol. 9, pp. 11678-11684, (Jul. 24, 2017).

Munther et al., "Probing the mechanical properties of vertically-stacked ultrathin graphene/Al2O3 heterostructures," Nanotechnology, vol. 30, No. 18, pp. 185703 1-9, (Feb. 2, 2019).

George, "Atomic Layer Deposition: An Overview," Chemical Reviews, vol. 110, No. 1, pp. 111-131, (Nov. 30, 2019).

Singh et al., "Polymer-supported titanium dioxide photocatalysts for environmental remediation: A review," Applied Catalysis A: General, vols. 462-463, pp. 178-195, (Jul. 10, 2013).

Wang et al., "Ultrathin Oxide Films by Atomic Layer Deposition on Graphene," Nano Letters, vol. 12, pp. 3706-3710, (Jun. 20, 2012).

* cited by examiner

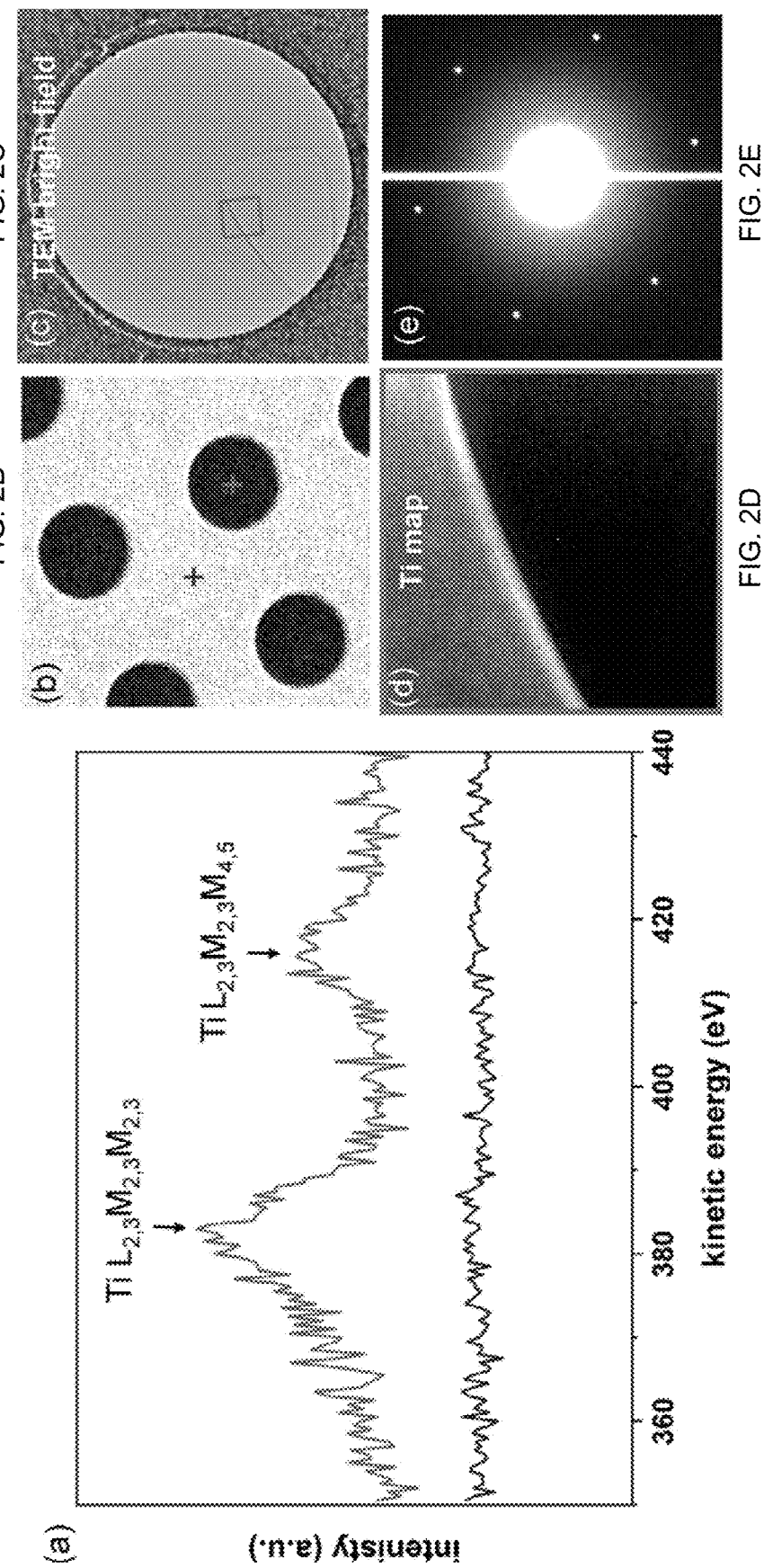

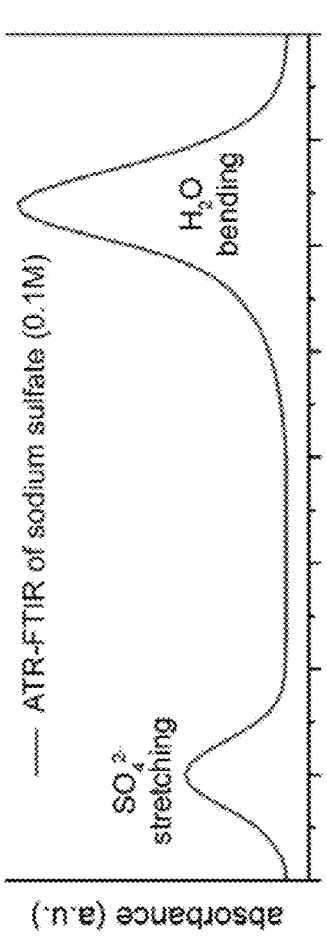
FIG. 5A
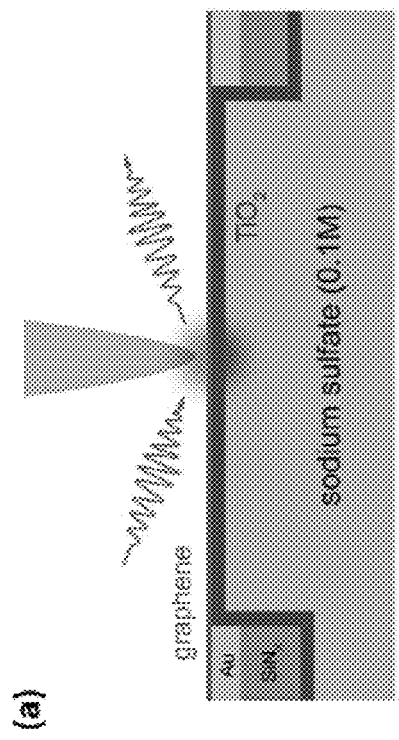
FIG. 5B
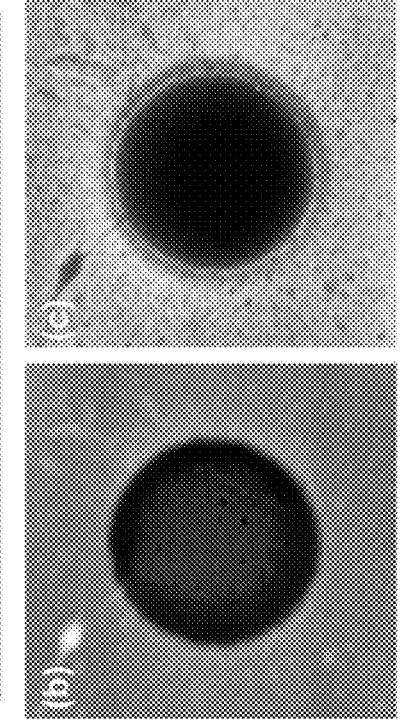
FIG. 5C
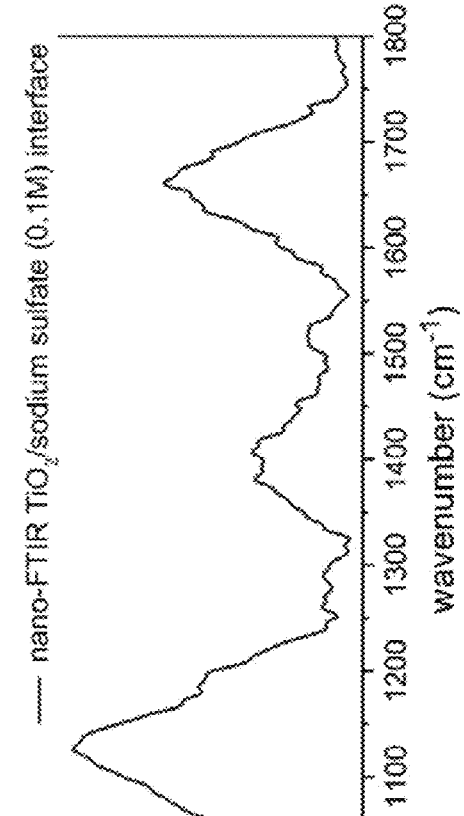
FIG. 5D
FIG. 5E

THIN FREE-STANDING OXIDE MEMBRANES

RELATED APPLICATIONS

This application claims priority to U.S. Provisional Patent Application No. 63/089,885, filed Oct. 9, 2020, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to metal-oxide films.

BACKGROUND

Metal and semiconductor oxides are some of the most abundant materials on Earth, and their interactions with aqueous solutions and atmospheric gases are at the base of corrosion, geochemical, catalytic, and electrochemical processes. In industry, metal-oxides play a crucial role in applications ranging from heterogeneous catalysis, photocatalysis, energy storage, fuel cells, and chemical sensors. The ability to characterize the metal-oxide interface with gases and liquids at the atomic/molecular scale is essential for understanding these processes.

Over the past decades, various surface-sensitive techniques have been developed toward this goal. These include electron and X-ray-based spectroscopies, such as X-ray photoelectron spectroscopy (XPS), electron-yield X-ray absorption spectroscopy (EY-XAS), Auger-electron spectroscopy (AES), scanning electron microscopy (SEM), and transmission electron microscopy (TEM), which provide structural and elemental identification of species at surfaces/interfaces. However, the current pressure range where these techniques operate is still lower than that needed in many practical reaction conditions, and their operation in liquid environments remains particularly difficult.

To extend the pressure range and to enable measurements in the liquid phase, thin film membranes acting as windows in environmental cells have been developed recently. Microfabricated thin silicon nitride films (5 nanometers (nm) to 200 nm) supported on silicon chips are the most popular ones and can be used as window materials for the separation of high vacuum and gases or liquid at ambient pressures. Si, $SiO_2$, thin carbon films, and graphene have also been used as thin film window materials for this purpose. In particular, graphene has extraordinary mechanical strength and can sustain large pressure differences while being impermeable to gases and liquids. The atomic-scale thickness of graphene makes it sufficiently transparent to electrons and for this reason it has been used in a variety of environmental cells for electron-based microscopies and spectroscopies, such as TEM, SEM, AES, and XPS. Recently, graphene membranes were also applied in infrared (IR) nanospectroscopy (nano-FTIR) studies of the molecular structure of liquids near graphene.

SUMMARY

Free-standing thin (e.g., about 2 nanometer thick) films of several oxides ($Al_2O_3$, $TiO_2$, and others) have been developed, which are mechanically robust and transparent to electrons with $E_{kin} \geq 200$ eV and to photons. The metal oxide films can be used in environmental X-ray photoelectron and infrared spectroscopy for molecular level studies of solid-gas ($\geq 1$ bar) and solid-liquid interfaces, for example. These metal oxide films can be used to close a reaction cell and as substrates and electrodes for electrochemical reactions. The properties of the metal oxide films can enable atomic/molecular level studies of interfacial phenomena, such as corrosion, catalysis, electrochemical reactions, energy storage, geochemistry, and biology, in a broad range of environmental conditions.

One innovative aspect of the subject matter described in this disclosure can be implemented in a method including providing a substrate. The substrate defines a hole having a diameter of about 500 nanometers to 5000 nanometers. A layer of metal is deposited on the substrate. A supporting layer is deposited on the layer of metal. A first side of the supporting layer is the side that is disposed on the layer of metal. A metal oxide layer is deposited on the first side of the supporting layer and on the substrate. In some implementations, the method further includes removing the supporting layer.

In some implementations, the metal layer is a metal from a group of gold (Au), platinum (Pt), and palladium (Pd). In some implementations, the supporting layer is graphene or a polymer. In some implementations, the supporting layer is a polymer from a group of polyvinyl formal and polymethyl methacrylate (PMMA).

In some implementations, depositing the metal oxide layer is performed using atomic layer deposition (ALD). In some implementations, the metal oxide layer is a metal oxide from the group of titanium dioxide ($TiO_2$), aluminum oxide ($Al_2O_3$), silicon dioxide ($SiO_2$), hafnium dioxide ($HfO_2$), a cobalt oxide ($CoO_x$), and an iron oxide ($FeO_x$). In some implementations, the metal oxide layer is amorphous. In some implementations, the metal oxide layer is polycrystalline. In some implementations, the metal oxide layer is about 1 nanometer to 20 nanometers thick.

Another innovative aspect of the subject matter described in this disclosure can be implemented in a method including providing a substrate. The substrate defines a hole having a diameter of about 500 nanometers to 5000 nanometers. A layer of metal is deposited on the substrate. A supporting layer is deposited on the layer of metal. A first side of the supporting layer is the side that is disposed on the layer of metal. A metal oxide layer is deposited on a second side of the supporting layer. In some implementations, the method further includes removing the supporting layer that is exposed by the hole defined in the substrate.

In some implementations, the metal layer is a metal from a group of gold (Au), platinum (Pt), and palladium (Pd). In some implementations, the supporting layer is graphene or a polymer. In some implementations, the supporting layer is a polymer from a group of polyvinyl formal and polymethyl methacrylate (PMMA).

In some implementations, depositing the metal oxide layer is performed using atomic layer deposition (ALD). In some implementations, the metal oxide layer is a metal oxide from the group of titanium dioxide ($TiO_2$), aluminum oxide ($Al_2O_3$), silicon dioxide ($SiO_2$), hafnium dioxide ($HfO_2$), a cobalt oxide ($CoO_x$), and an iron oxide ($FeO_x$). In some implementations, the metal oxide layer is amorphous. In some implementations, the metal oxide layer is polycrystalline. In some implementations, the metal oxide layer is about 1 nanometer to 20 nanometers thick.

BRIEF DESCRIPTION OF THE DRAWINGS

FIG. 2A shows the results of high spatial resolution (i.e., a few nm) Auger-electron spectroscopy on the graphene/Au/SiN region and on the free-standing graphene/$TiO_2$ window. The electron beam was illuminated from the side opposite to the $TiO_2$ deposition. FIG. 2B shows an SEM image showing marks at the location where the Auger spectra were taken. FIG. 2C shows a TEM bright-field image from a partially ruptured graphene/$TiO_2$ window (Ø=1000 nm). FIG. 2D shows an EELS (Ti-L edge) map from the region marked by a square in FIG. 2C containing the edge of the ruptured. FIG. 2E shows an electron diffraction pattern from a $TiO_2$/graphene region showing the hexagonal pattern from graphene with the amorphous $TiO_2$ contributing only to the background.

FIG. 4A shows an N 1s spectrum containing a sharp peak from $N_2(g)$ in air and a smaller peak from the SiN support. FIG. 4B shows an O 1s spectrum showing the doublet peak from $O_2(g)$ in air and a strong, broad peak from $Al_2O_3$. The photon energy was 1135 eV.

FIG. 5A shows a schematic of the plasmonically enhanced nano-FTIR experiment with the AFM tip situated over the metal-oxide window closing the cell filled with liquid. Broadband synchrotron IR radiation was focused on the apex of the AFM tip, which enhanced the electromagnetic field in the proximity of the apex in a range roughly equal to the tip radius (few nm) and scattered it to the far field. FIG. 5B shows the topography and FIG. 5C shows the second-harmonic optical amplitude images from the IR light scattered by the tip over the graphene/$TiO_2$ window covering a sodium sulfate aqueous solution (0.1 M) inside the cell. FIG. 5D shows ATR-FTIR results from a droplet of 0.1 M sodium sulfate aqueous solution. FIG. 5E shows results of nano-FTIR of the 0.1 M sodium sulfate solution acquired with the tip over the graphene/$TiO_2$ window (3 nm thick). The nano-FTIR spectrum was obtained from the phase of the scattered signal at the second harmonic of the cantilever oscillation frequency, which corresponds to the absorption coefficient of the material. Notice the different amplitudes of the bulk (ATR-FTIR) and nano-FTIR peaks of the $SO_4^{2-}$-stretching and water-bending modes, and the presence of additional peaks between these two, visible only in the near-surface region detected by nano-FTIR, showing the difference in composition between the bulk and the near-surface region (nm).

DETAILED DESCRIPTION

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The terms "substantially" and the like are used to indicate that a value is close to a targeted value, where close can mean, for example, the value is within 80% of the targeted value, within 85% of the targeted value, within 90% of the targeted value, within 95% of the targeted value, or within 99% of the targeted value.

Described herein are thin (e.g., a few nanometers thick) membranes (also referred to as films herein) based on oxide materials. These thin oxides have remarkable mechanical strength and can withstand large pressure differences (≥1 bar), which makes them useful as cell membrane windows. Like graphene, they are transparent to photons and to electrons with a wide range of kinetic energies. The membranes can be used as supports of metal particles for catalysis studies, as electrodes in electrocatalysis, in batteries, and in many other applications.

Figure 6:
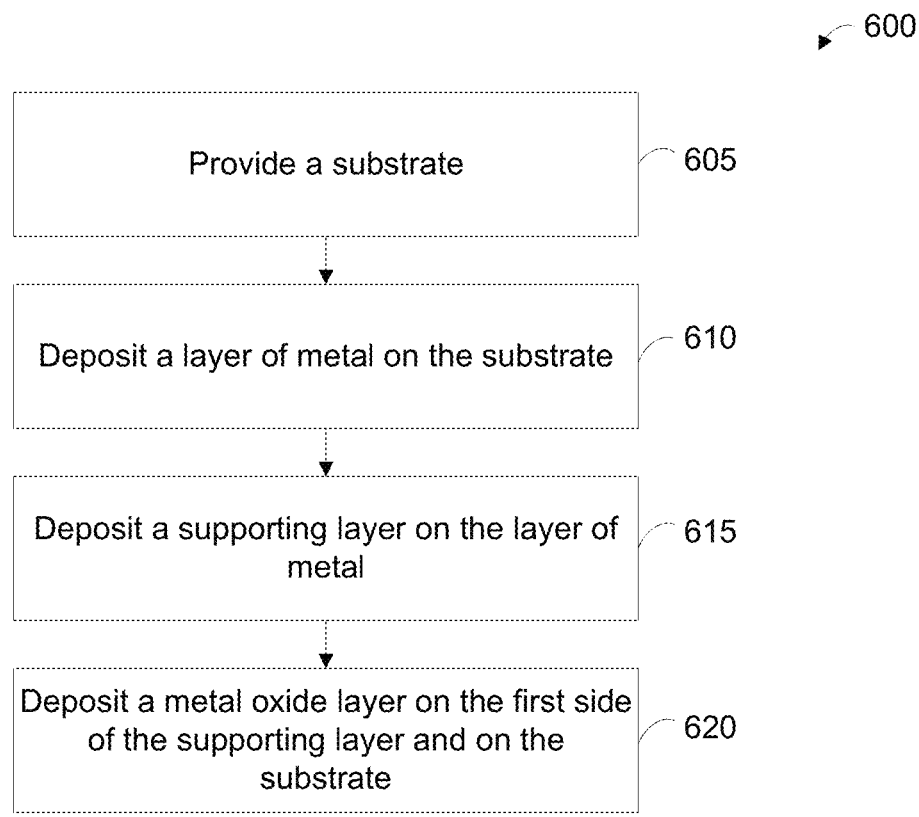
FIG. 6 shows an example of a flow diagram illustrating a manufacturing process for an oxide film.

FIG. 6 shows an example of a flow diagram illustrating a manufacturing process for an oxide film. FIGS. 7A-7D show examples of schematic illustrations of an oxide film at various stages in the manufacturing process.

Starting at block 605 of the process 600 shown in FIG. 6, a substrate is provided. The substrate defines a hole or holes having a diameter of about 500 nanometers (nm) to 5000 nm. In some embodiments, the hole defined in the substrate is a hole that pass completely through the substrate. In some embodiments, the hole has a diameter of about 500 nm to 3000 nm, or about 500 nm to 2000 nm.

In some embodiments, the substrate comprises a silicon wafer with a layer of silicon nitride (SiN) disposed on one side of the silicon wafer. In some embodiments, the layer of SiN is about 50 nm to 150 nm thick, of about 100 nm thick. In some embodiments, the silicon of the wafer is removed from the area in which the hole is defined in the SiN, leaving a SiN layer with the hole defined therein, with the remainder of the SiN layer being supported and in contact with the silicon wafer.

At block 610, a layer of metal is deposited on the substrate. In some embodiments, the metal layer is a metal from a group of gold (Au), platinum (Pt), and palladium (Pd). In some embodiments, the metal layer is about 2 nm to 10 nm thick.

Figure 7A:
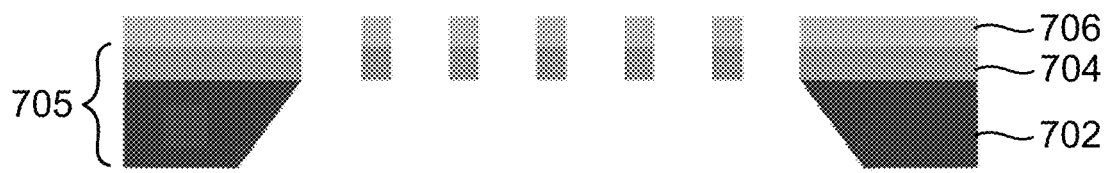
FIGS. 7A-7D show examples of schematic illustrations of an oxide film at various stages in the manufacturing process.

FIG. 7A shows the structure at the end of block 610 of the process 600. As shown in FIG. 7A, the substrate 705 comprises a silicon substrate 702 with a layer of SiN 704 disposed thereon. A layer of metal 706 is disposed on the substrate 705.

At block 615, a supporting layer is deposited on the layer of metal. A first side of the supporting layer is the side of the supporting layer that is disposed on the layer of metal. Due to the hole in the substrate, some of the first side of the supporting layer is exposed. In some embodiments, the supporting layer adheres well to the metal layer. In some embodiments, the layer of metal serves to improve the adhesion between the substrate and the supporting layer.

In some embodiments, the supporting layer is graphene or a polymer. In some embodiments, a graphene supporting layer is less than about 1 nm thick. In some embodiments, a graphene supporting layer can provide electrical conductivity to devices that incorporate the metal oxide film. In some embodiments, the supporting layer is a polymer from a group of polyvinyl formal and polymethyl methacrylate (PMMA). In some embodiments, the supporting layer comprises a polymer that can be readily dissolved in a solvent. In some embodiments, the supporting layer is a polymer layer and is about 1 nm to 1 millimeter (mm) thick.

In some embodiments, a graphene supporting layer can be deposited on the layer of metal by first transferring graphene to a water reservoir. The structure (as fabricated thus far) can be placed under the graphene and lifted up from the air/water interface to transfer the graphene to the layer of metal.

In some embodiments, a polymer supporting layer can be deposited on the layer of metal by spin-coating the polymer on the layer of metal. In some embodiments, a polyvinyl formal supporting layer can be deposited on the layer of metal by first immersing a substrate (e.g., a glass microscope slide) in a vinyl formal solution (1,2-dichloroethane) to form a polyvinyl formal film on the substrate. The polyvinyl formal film can be floated on a water surface by immersing the substrate in water. The structure (as fabricated thus far) can then be placed under the polyvinyl formal film and lifted up from the air/water interface to transfer the polyvinyl formal film to the layer of metal.

Figure 7B:
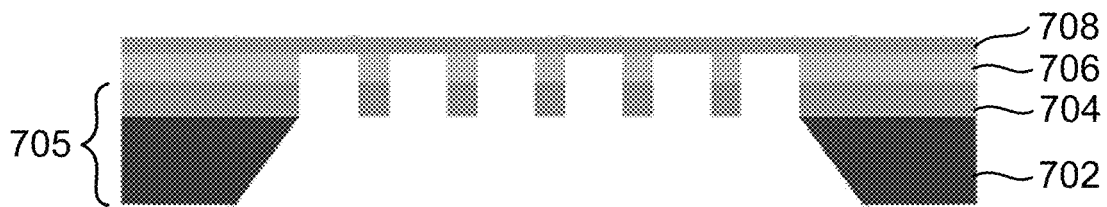

FIG. 7B shows the structure at the end of block 610 of the process 600. As shown in FIG. 7B, the layer of metal 706 is disposed on the substrate 705, and a supporting layer 708 is disposed on the layer of metal 706.

Returning to FIG. 6, at block 620 a metal oxide layer is deposited on the first side of the supporting layer and on the substrate. Is some embodiments, the metal oxide layer is deposited using atomic layer deposition (ALD). In some embodiments, the atomic layer deposition is plasma-enhanced atomic layer deposition (PE-ALD). In some embodiment, the atomic layer deposition is thermal atomic layer deposition. Further, in some embodiments, ALD co-deposition can be used to deposit doped-metal oxides.

In some embodiments, the metal oxide layer is a metal oxide from the group of titanium dioxide ($TiO_2$), aluminum oxide ($Al_2O_3$), silicon dioxide ($SiO_2$), hafnium dioxide ($HfO_2$), a cobalt oxide ($CoO_x$), and an iron oxide ($FeO_x$). In some embodiments, the metal oxide layer is about 1 nm to 20 nm thick, about 1 nm to 10 nm thick, about 1 nm to 5 nm thick, about 1 nm to 3 nm thick, or about 2 nm thick. The thicker the metal oxide layer is, the stronger it is. However, thicker metal oxide layers are more opaque to light and other radiation as well has having higher electrical resistivity. In some embodiments, the metal oxide layer is amorphous. In some embodiments, the metal oxide layer is polycrystalline.

Figure 7C:
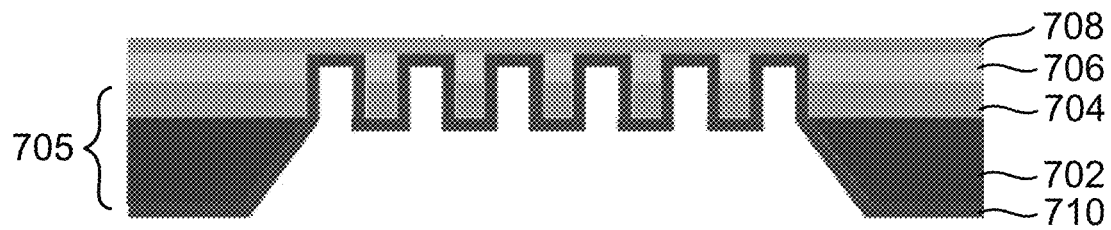

FIG. 7C shows the structure at the end of block 620 of the process 600. As shown in FIG. 7C, the layer of metal 706 is disposed on the substrate 705, and a supporting layer 708 is disposed on the layer of metal 706. A metal oxide layer 710 is disposed on the first side of the supporting layer 708 and the substrate 705.

In some embodiments, the process 600 shown in FIG. 6 further includes removing the supporting layer. For example, when the supporting layer is graphene, the graphene can be removed using an oxygen plasma. When the support layer is a polymer, the polymer can be removed by dissolving it in a solvent. For example, when the supporting layer is polyvinyl formal, the polyvinyl formal can be dissolved in chloroform.

Figure 7D:
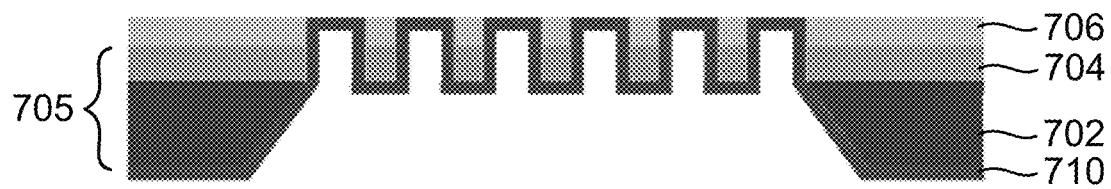

FIG. 7D shows the structure when the supporting layer is removed. As shown in FIG. 7D, the layer of metal 706 is disposed on the substrate 705. The metal oxide layer 710 is disposed on the substrate 705. The supporting layer has been removed from the metal layer 706 and areas where the metal oxide layer 710 was disposed thereon.

Figure 8:
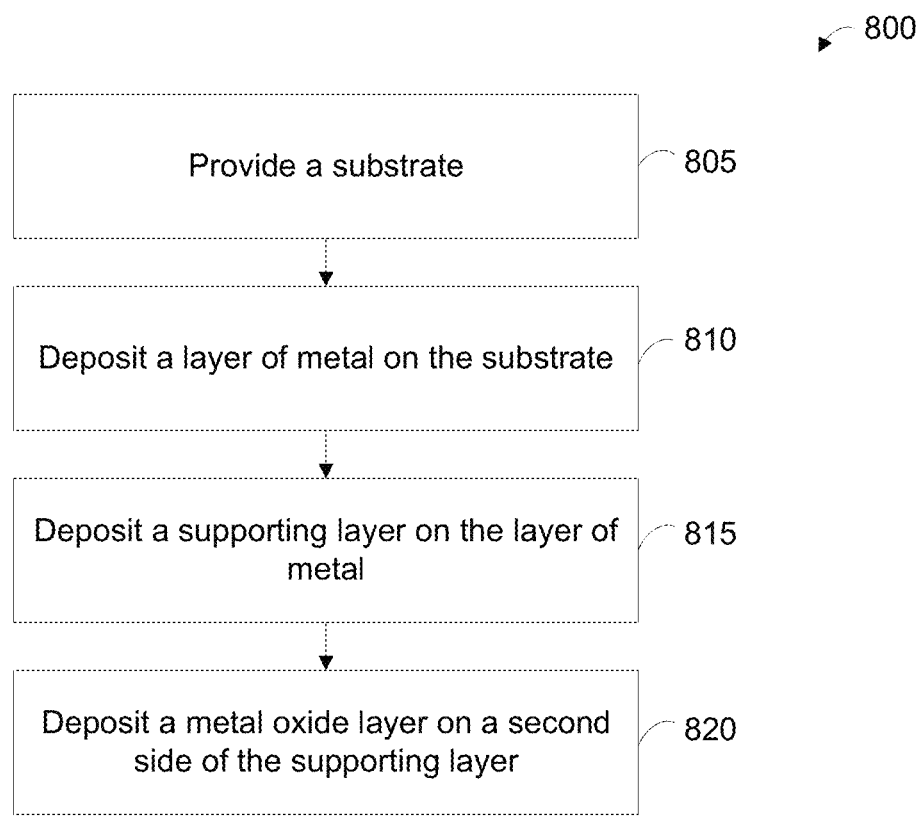
FIG. 8 shows an example of a flow diagram illustrating a manufacturing process for an oxide film.
Figure 9A:
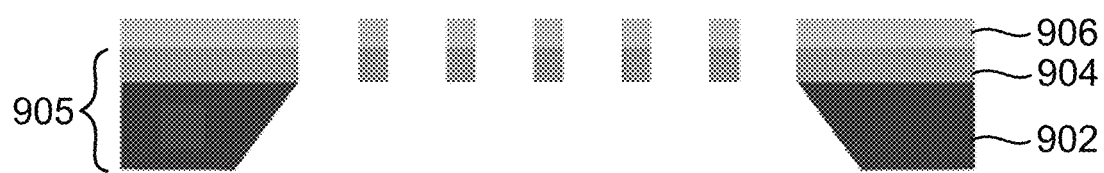
FIGS. 9A-9C show examples of schematic illustrations of an oxide film at various stages in the manufacturing process.
Figure 9B:
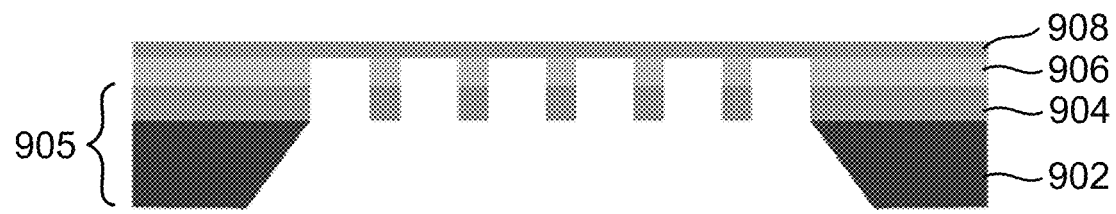
Figure 9C:
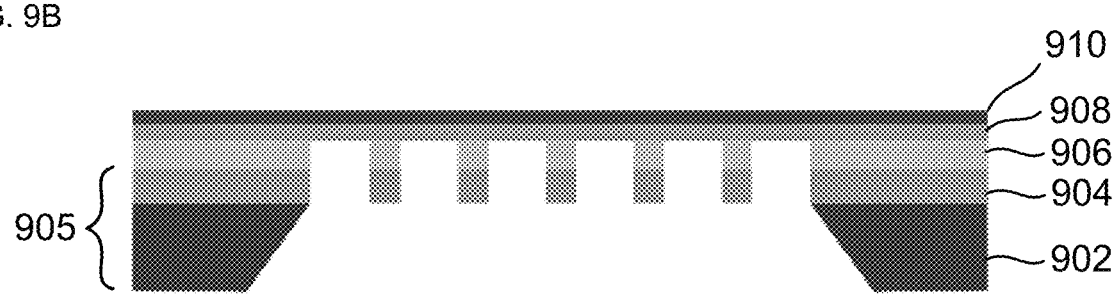

FIG. 8 shows an example of a flow diagram illustrating a manufacturing process for an oxide film. FIGS. 9A-9C show examples of schematic illustrations of an oxide film at various stages in the manufacturing process.

The process 600 shown in FIG. 6 and the process 800 shown in FIG. 8 are similar, and for some operations the same. Starting at block 805 of the process 800, a substrate is provided. The substrate defines a hole or holes having a diameter of about 500 nm to 5000 nm. Block 805 of the process 800 is the same as block 605 of the process 600.

At block 810, a layer of metal is deposited on the substrate. Block 810 of the process 800 is the same as block 610 of the process 600. FIG. 9A shows the structure at the end of block 810 of the process 800. As shown in FIG. 9A, the substrate 905 comprises a silicon substrate 902 with a layer of SiN 904 disposed thereon. A layer of metal 906 is disposed on the substrate 905.

At block 815, a supporting layer is deposited on the layer of metal. A first side of the supporting layer is the side that is disposed on the layer of metal. Block 815 of the process 800 is the same as block 615 of the process 600. FIG. 9B shows the structure at the end of block 815 of the process 800. As shown in FIG. 9B, the layer of metal 906 is disposed on the substrate 905, and a supporting layer 908 is disposed on the layer of metal 906.

At block 820, a metal oxide layer is deposited on a second side of the supporting layer. The second side of supporting layer is the side of the supporting layer not disposed on the layer of metal. In some embodiments, the process used to deposit the metal oxide layer, the thickness of metal oxide layer, and the metal oxide of the metal oxide layer are the same as described with respect to block 620 in the process 600.

FIG. 9C shows the structure at the end of block 620 of the process 600. As shown in FIG. 9C, the layer of metal 906 is disposed on the substrate 905, and a supporting layer 908 is disposed on the layer of metal 906. A metal oxide layer 910 is disposed on the second side of the supporting layer 908.

In some embodiments, the process 800 shown in FIG. 8 further includes removing the supporting layer that is exposed by the hole defined in the substrate. For example, when the supporting layer is graphene, the graphene can be removed using an oxygen plasma. When the support layer is a polymer, the polymer can be removed by dissolving it in a solvent.

In some embodiments of the processes described herein, instead of depositing a metal oxide layer, a metal layer is deposited. In some embodiments, the metal layer consists essentially of platinum, palladium, or gold. In some embodiments, the metal layer is about 2 nm to 20 nm thick. In some embodiments, the metal layer is transparent to an electric field.

In some embodiments of the processes described herein, instead of depositing a metal oxide layer, a different binary compound is deposited. Such binary compounds include, for example, selenides, nitrides, fluorides, and sulfides (e.g., $FeS_2$). In some embodiments, the binary compound layer is about 2 nm to 20 nm thick.

In some embodiments of the processes described herein, instead of depositing a metal oxide layer, a complex oxide layer is deposited. Such complex oxides include, for example, quaternary compounds (e.g., indium gallium zinc oxide (IGZO)). In some embodiments, the complex oxide layer is about 2 nm to 20 nm thick. Some complex oxides can be deposited by altering ALD cycles in specific recipes, which allows for variation and control of the stoichiometry of the oxide. Further, ALD co-deposition can be used to grow doped materials or mixtures.

In some embodiments of the processes described herein, instead of depositing a metal oxide layer, a heterostructure is deposited. For example, the use of bilayer systems can give a better mechanical stability. For example, $Al_2O_3/MeO_x$ structures, where the $MeO_x$ is the oxide of interest to study in contact with a gas or liquid, the use of $Al_2O_3$ can give mechanical stability to the layer. In some embodiments, the heterostructure is about 2 nm to 20 nm thick.

The oxide films fabricated using the above methods can be used in a number of different experimental techniques and experimental apparatus, including electron-based and x-ray-based microscopies and spectroscopies, such as TEM, SEM, AES, and XPS, for example. Some experimental techniques and experimental apparatus are further described herein.

The following examples are intended to be examples of the embodiments disclosed herein, and are not intended to be limiting.

Example—Fabrication and Chemical Composition of the Metal-Oxide Films

In a specific fabrication process for an oxide membrane, we started with commercial silicon nitride (SiN) membranes perforated with holes of about 500 nm to 2000 nm diameter. We coat these membranes with gold (or other metals) subsequently cover them with a graphene layer on the flat side. The gold serves to improve adhesion and to ensure good electrical connectivity between graphene domains. The oxide film was grown by plasma-enhanced atomic layer deposition (PE-ALD) on either side of the graphene. The graphene can be removed, if desired, by oxygen plasma to leave only the suspended metal-oxide. However, we sometimes kept the graphene on the external side of the window as it adds mechanical strength and because it provides good electrical conductivity for biasing the metal-oxide when acting as an electrode.

Figures 1A, 1B, 1C:
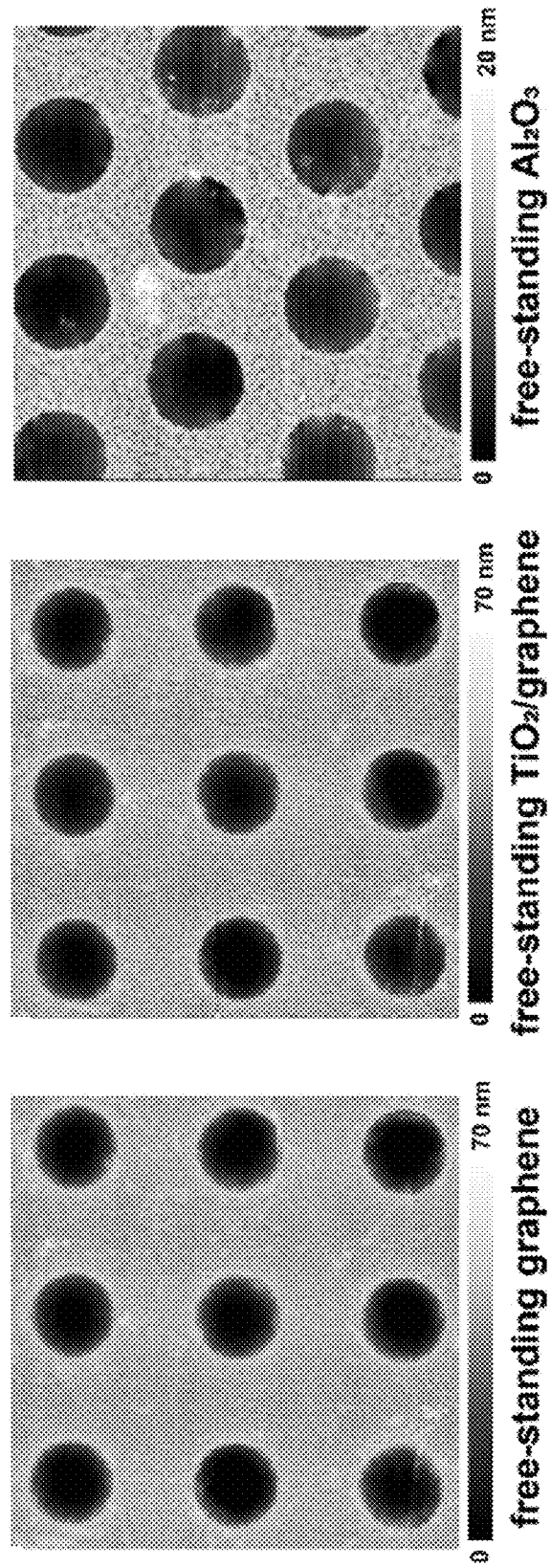
FIG. 1A shows an AFM topographic image showing a region with a graphene-capped array of holes (Ø=1 µm), corresponding to block 615 of the process 600 shown in FIG. 6.
FIG. 1B shows an AFM topographic image after deposition of a $TiO_2$ film on the flat side of the graphene showing the uniformity of film (corresponding to block 620 of the process 600 shown in FIG. 6).
FIG. 1C shows an AFM topographic image showing a region with a 2-nm-thick $Al_2O_3$ film covering the holes (Ø=500 nm, corresponding to when the supporting layer is removed in some embodiments of the process 600 shown in FIG. 6). In this case, polyvinyl formal was used as a support for the PE-ALD process on the corrugated side and dissolved afterward, leaving the $Al_2O_3$ film suspended.

FIG. 1A shows an atomic-force microscopy (AFM) topographic image of a region of the SiN sample with holes capped with graphene, while FIG. 1B is an image of the same area with a 2-nm-thick $TiO_2$ film grown on the flat side, showing its excellent conformal distribution. FIG. 1C shows a region of an $Al_2O_3$-covered array of holes, which were initially covered by polyvinyl formal. The polymer acted as support for the PE-ALD growth and was subsequently dissolved in chloroform so that the metal-oxide membrane is freely suspended. The local thickness of the metal-oxides was estimated by electron energy-loss spectroscopy (EELS) using the log-ratio method.

The chemical composition and uniformity of the films were examined by scanning Auger-electron spectroscopy (with a spatial resolution of a few nm) and by TEM/EELS. As shown in FIG. 2A, when $TiO_2$ is deposited on the side facing the cell interior (corresponding to the SEM image in FIG. 2B), the Ti LMM Auger-electron peaks only appear when the electron beam is focused on the free-standing graphene/$TiO_2$ but not on the region between holes. Because of the short inelastic mean free path of the 380 eV Auger electrons (about 1 nm), the spectra show only Ti peaks on the suspended graphene region of the membrane. FIG. 2C shows a TEM image of a region of a SiN sample with a hole partly covered by a free-standing graphene/$TiO_2$ membrane (the missing part of the membrane is the brightest part). FIG. 2D shows a map of the Ti-$L_{2,3}$ loss peak intensity (EELS) from the region marked by a square in FIG. 2C that includes the ruptured edge. The smoothness of the contrast over the film, and its abrupt change across the edge, demonstrates the chemical uniformity of the metal-oxide layer over the free-standing graphene. An electron-diffraction pattern from the graphene/$TiO_2$ area is shown in FIG. 2E. Only the hexagonal diffraction pattern can be seen and it must be from graphene since at this low-temperature (40° C. to 120° C.) PE-ALD conditions, the metal-oxide is expected to be amorphous and does not produce diffracted beams. Similar results were obtained for $Al_2O_3$/graphene membranes.

At the temperature used in the PE-ALD growth process, a high content of carbon (around 15%) was observed by XPS as a residue of the organic precursor. Surface OH⁻ groups could also bring out an excess of oxygen.

Example—Mechanical Properties of Metal-Oxide Films

Figure 3:
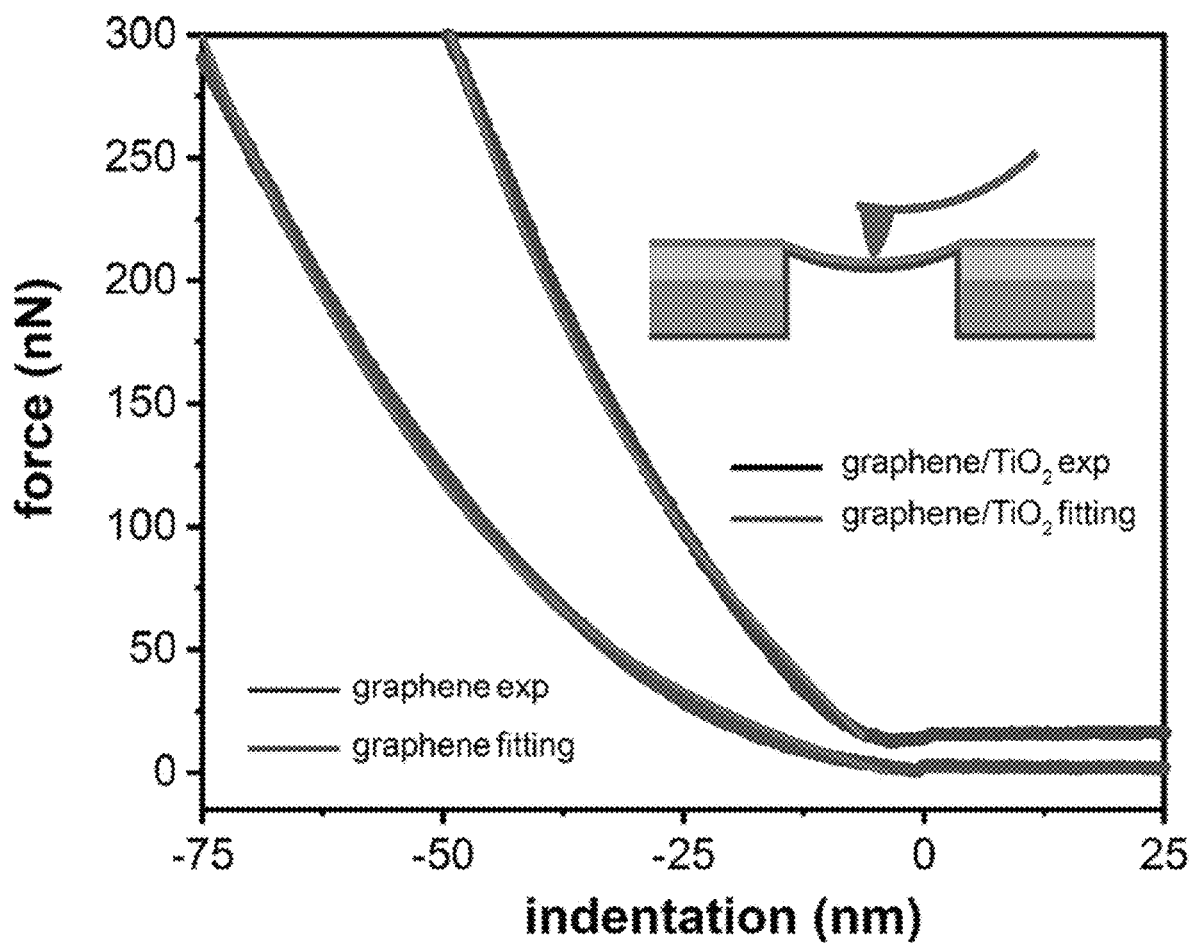
FIG. 3 shows AFM nanoindentation curves of suspended graphene and graphene/$TiO_2$. The curves correspond to the fitting results of graphene and graphene/$TiO_2$, using equation 1. The inset shows a schematic of the AFM nanoindentation experiment.

The mechanical behavior of the free-standing metal-oxide membranes was investigated by nanoindentation using an AFM tip. To rule out indentation-induced damage to the tip, AFM topographic images were acquired before and after each indentation. FIG. 3 shows representative force-distance curves on a 1-μm-diameter hole covered with a suspended graphene membrane without and with a 2-nm-thick $TiO_2$ film deposited on the side facing the cell interior. Only a small difference is visible between the loading and unloading curves in both cases, suggesting an elastic deformation process and no sliding between the graphene and TiO$_2$ layers during indentation, indicative of strong adhesion between graphene and TiO$_2$. The effective Young's modulus (E) of the suspended membrane was calculated using equation 1, which describes the force versus indentation depth of a suspended clamped circular sheet of an isotropic elastic material under a centrally applied load $$F = \left[3\frac{4\pi E}{1-v^2}\left(\frac{t^3}{a^2}\right)\right]\delta + (\pi T)\delta + \left(\frac{q^3 Et}{a^2}\right)\delta^3 \quad (1)$$

where t=thickness of the suspended membrane, v=effective Poisson's ratio, a=radius of the suspended membrane, T=pretension in the suspended membrane, q is a dimensionless parameter equal to 1/(1.05-0.15v-0.16v), F=applied force, and δ=indentation depth. By using equation 1 and fitting the force-indentation curves, shown in FIG. 3 as curves for graphene and graphene/TiO$_2$, we obtain the Young's modulus of graphene, $E_{graphene}$, of around 404±14 GPa and that of the 2-nm-thick TiO$_2$ film on graphene, $E_{graphene/TiO2}$, of 200±100 GPa. These values are close to the values reported in the literature. The $E_{graphene}$ value, however, is lower than that reported for graphene prepared by mechanical exfoliation of graphite (~1 TPa), which could be due to defects in the graphene used in this study stemming from the chemical-vapor-deposition process and/or from the transfer processes. Assuming a tip radius between 10 and 50 nm, we estimate that our free-standing metal-oxide membrane can withstand pressures higher than 10$^6$ Pa, that is, more than 10 bar, which explains its good performance as an environmental-cell window to contain high-pressure gas or liquids.

Example—Metal-Oxide Membranes for Electron Spectroscopy Studies of Solid-Gas Interfaces The submicrometer thickness of SiN membranes (and other materials) makes them transparent to high-energy radiation, in particular ≥100 keV electrons and X-rays, and for that reason they are frequently used for TEM and X-ray absorption spectroscopies in fluorescent-yield detection mode (FY-XAS). Surface sensitive spectroscopies such as XPS and EY-XAS, which use emitted electrons traversing the membrane, are not possible with standard SiN membranes because of the short mean free path of a few nanometers of low-energy electrons in solid materials. However, the ultrathin metal-oxide films described herein make possible XPS measurements of species present near the membrane, similar to the case of graphene.

Figures 4A, 4B:
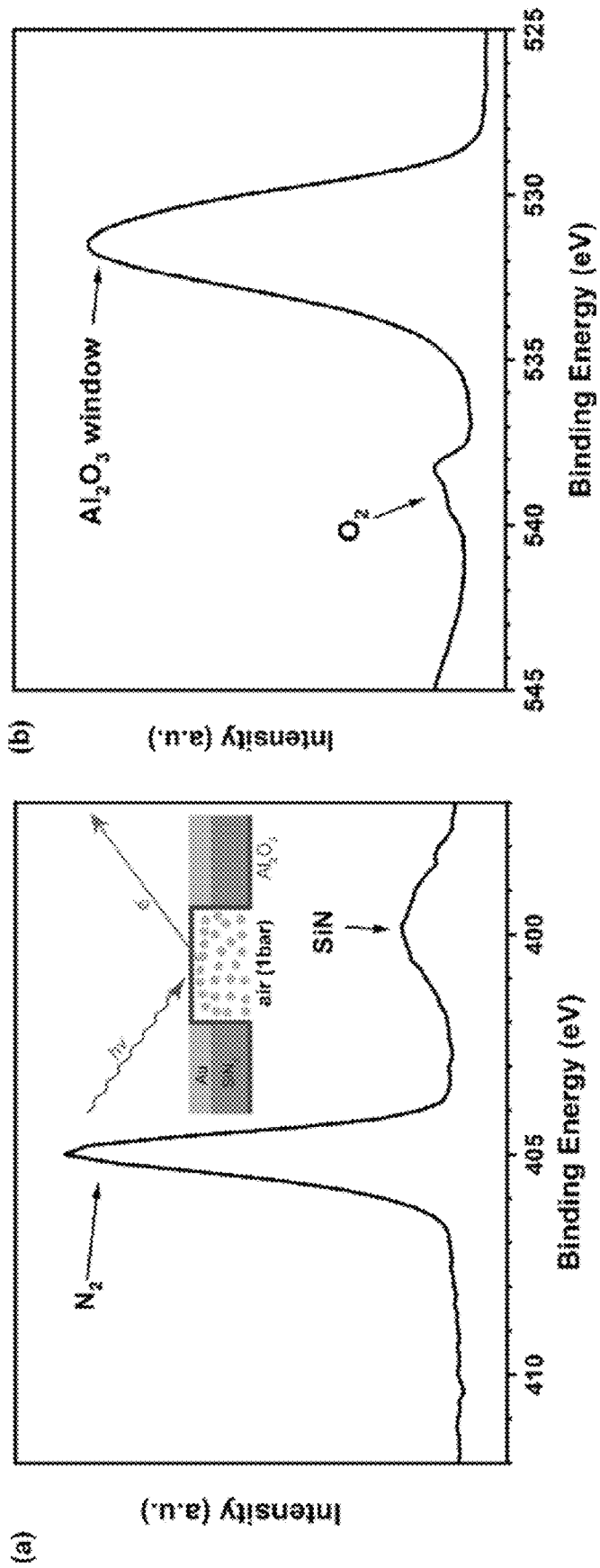
FIGS. 4A and 4B show the results of XPS measurements through a 2-nm-thick $Al_2O_3$ membrane closing a cell filled with 1 bar of air. The cell was located inside an XPS vacuum chamber with a $10^{-6}$ Torr to $10^{-7}$ Torr base pressure.

FIGS. 4A and 4B show the N 1s and O 1s photoelectron spectra from air at 1 bar enclosed by a 2-nm-thick Al$_2$O$_3$ free-standing membrane. The cell was located inside a vacuum chamber with 10$^{-6}$ Torr to 10$^{-7}$ Torr base pressure containing an XPS spectrometer. In FIG. 4A, The N 1s spectrum shows a sharp peak at a binding energy of ~405 eV from the N$_2$ gas phase, together with a small contribution at ~400 eV from N in the SiN support. Similarly, in FIG. 4B the O 1s spectrum shows a doublet peak (due to paramagnetic splitting) at ~537 eV to 540 eV corresponding to the O$_2$ gas phase and another peak at 532.5 eV from the O in the Al$_2$O$_3$ membrane. The integrated intensity ratio of the N$_2$ to O$_2$ peaks is close to 4, as expected from the air composition.

Example—Infrared Spectroscopy Studies at the Interface between Metal-Oxide and Liquid Vibrational spectroscopies based on photons, such as Fourier-transform infrared spectroscopy (FTIR), Raman spectroscopy, and sum-frequency-generation spectroscopy (SFG) are powerful and noninvasive tools for studies of surfaces and interfaces. Most materials, especially insulating metal-oxides, are highly transparent to visible and infrared light, and thus they allow for easy access to the buried solid-liquid interface. The lack of spatial resolution, particularly in the IR case, can be overcome by taking advantage of the plasmonic enhancement in confined geometries and near the corners of sharp objects. We recently demonstrated this using an AFM tip to achieve nanoscale resolution FTIR spectra through a graphene membrane electrode to determine the nature of the species in the vicinity of the electrode (i.e., in the electrical double layer) and their variation with applied bias.

Here, we demonstrate that this is also possible with our ultrathin graphene/metal-oxide membranes. FIG. 5A shows the schematic of the nano-FTIR measurement through the graphene/TiO$_2$ window of a liquid in the cell. FIG. 5B shows the AFM topographic image of a region containing a graphene/TiO$_2$ (3 nm thick) window in contact with a 0.1 M sodium sulfate aqueous solution. The corresponding amplitude of the scattered IR light at the second harmonic of the tip oscillation is shown in FIG. 5C. The amplitude over the graphene/TiO$_2$ window is much smaller than that over the graphene-gold region, as expected from the negligible absorption of graphene/gold compared to the poorly reflective graphene/TiO$_2$ window. The nano-FTIR spectrum of a 0.1 M sodium sulfate solution in contact with the TiO$_2$ of the graphene/TiO$_2$ membrane at open circuit condition (averaged from spectra acquired on many points in the membrane) is shown in FIG. 5E. For comparison, the attenuated total reflection FTIR (ATR-FTIR) from a 0.1 M droplet of aqueous sodium sulfate solution is shown in FIG. 5D. As can be seen, the expected peaks from the antisymmetric S=O stretching mode in SO$_4^{2-}$ (around 1100 cm$^{-1}$) and from the bending mode of water (~1650 cm$^{-1}$) are visible in both cases. However, the sulfate-to-water-peak ratio in nano-FTIR is much larger than that of the ATR-FTIR measurements with the former reflecting the near-surface region (i.e., nanometers) while the latter reflects the bulk (i.e., microns) composition of the solution. Several additional peaks between 1200 and 1600 cm$^{-1}$ are also present in the nano-FTIR spectrum, the nature of which is under investigation.

Interestingly, while in the case of a pure graphene membrane in contact with 0.1 M ammonium sulfate solution, the sulfate peak is about 4 times more intense than that of water, the ratio near the TiO$_2$ film is about 2 or less. These results indicate that the structure of the electrolyte in the electrical double layer is highly influenced by the nature of the electrode and by the additional hydrogen-bonding of water with O in the metal-oxide surface, which provides an anchoring and orienting mechanism for water that is very different from that in the hydrophobic graphene.

Example—Summary

In the Examples we have shown that mechanically robust, free-standing, ultrathin metal-oxide membranes can be fabricated by PE-ALD on graphene and on polymer supports. The oxide membranes are amorphous, uniform in thickness, and have compositions similar to those of the corresponding bulk oxides. Our proof-of-concept experiments show that they can be used as windows in environmental cells for XPS and nano-FTIR spectroscopic studies of gases (>1 bar) and of liquids near the interface. Their small thickness and good mechanical strength make them applicable to other electron/X-ray microscopy/spectroscopy or scanning probe techniques.

By using different precursors and growing temperatures, a wide range of oxides of metals and semiconductors, including $SiO_2$, $CoO_x$, $HfO_2$, and so forth, could be fabricated and used as suspended ultrathin films with different stoichiometry and crystallinity. Therefore, we anticipate that the platform developed and presented here will open up new avenues for the study of catalytic, electrochemical, geochemical, and other reactions at interfaces in practical conditions, as demonstrated by the results reported here. In addition, the ALD technique can also be used to grow membranes of other practical materials, such as nitrides, sulfides, noble metals, and 2D materials. Besides the applications for chemical studies just mentioned, the physical properties of the ultrathin metal-oxides can vary substantially from those of their bulk counterparts, including their magnetic properties and electron conductivity, which will be explored in the future. In the device area, the subsequent deposition of periodic array structures with different dielectric constants could be an ideal platform for photonic crystals and may be useful for vibrational spectroscopies and biochemical sensors.

CONCLUSION

Further details related to the embodiments described herein can be found in Yi-Hsien Lu et al., "Ultrathin Free-Standing Oxide Membranes for Electron and Photon Spectroscopy Studies of Solid-Gas and Solid-Liquid Interfaces," Nano Lett. 2020, 20, 9, 6364-6371, which is herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A method comprising:
providing a layer of silicon nitride, the layer of silicon nitride having a hole therein, the hole having a diameter of about 500 nanometers to 5000 nanometers;
depositing a layer of metal on the layer of silicon nitride;
depositing a supporting layer on the layer of metal, a first side of the supporting layer being the side that is disposed on the layer of metal; and
depositing a metal oxide layer on the first side of the supporting layer and on the layer of silicon nitride.

2. The method of claim 1, further comprising:
removing the supporting layer.

3. The method of claim 1, wherein the metal layer is gold (Au).

4. The method of claim 1, wherein the supporting layer is graphene or a polymer.

5. The method of claim 1, wherein the supporting layer is a polymer from the group consisting of polyvinyl formal and polymethyl methacrylate (PMMA).

6. The method of claim 1, wherein depositing the metal oxide layer is performed using atomic layer deposition (ALD).

7. The method of claim 1, wherein the metal oxide layer is a metal oxide from the group consisting of titanium dioxide ($TiO_2$), aluminum oxide ($Al_2O_3$), silicon dioxide ($SiO_2$), hafnium dioxide ($HfO_2$), and a cobalt oxide ($CoO_x$).

8. The method of claim 1, wherein the metal oxide layer is amorphous.

9. The method of claim 1, wherein the metal oxide layer is about 1 nanometer to 20 nanometers thick.

10. A method comprising:
providing a layer of silicon nitride, the layer of silicon nitride having a hole therein, the hole having a diameter of about 500 nanometers to 5000 nanometers;
depositing a layer of metal on the layer of silicon nitride;
depositing a supporting layer on the layer of metal, the supporting layer being a polymer, a first side of the supporting layer being the side that is disposed on the layer of metal; and
depositing a metal oxide layer on a second side of the supporting layer.

11. The method of claim 10, further comprising:
removing the supporting layer that is exposed by the hole in the layer of silicon nitride.

12. The method of claim 10, wherein the metal layer is gold (Au).

13. The method of claim 10, wherein the polymer is a polymer from the group consisting of polyvinyl formal and polymethyl methacrylate (PMMA).

14. The method of claim 10, wherein depositing the metal oxide layer is performed using atomic layer deposition (ALD).

15. The method of claim 10, wherein the metal oxide layer is a metal oxide from the group consisting of titanium dioxide ($TiO_2$), aluminum oxide ($Al_2O_3$), silicon dioxide ($SiO_2$), hafnium dioxide ($HfO_2$), and a cobalt oxide ($CoO_x$).

16. The method of claim 10, wherein the metal oxide layer is amorphous.

17. The method of claim 10, wherein the metal oxide layer is about 1 nanometer to 20 nanometers thick.

* * * * *